United States Patent
Gleason et al.

(10) Patent No.: US 9,085,011 B2
(45) Date of Patent: Jul. 21, 2015

(54) DRIVER CIRCUIT FOR ELECTRO-ACTIVE POLYMER DEVICES

(71) Applicant: Apple Inc., Cupertino, CA (US)

(72) Inventors: Jeffrey N. Gleason, San Francisco, CA (US); Richard H. Tsai, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 30 days.

(21) Appl. No.: 14/037,095

(22) Filed: Sep. 25, 2013

(65) Prior Publication Data

US 2015/0085180 A1    Mar. 26, 2015

(51) Int. Cl.
| | |
|---|---|
| G02B 7/02 | (2006.01) |
| H01L 41/08 | (2006.01) |
| H02N 2/00 | (2006.01) |
| B06B 1/02 | (2006.01) |
| H04N 5/225 | (2006.01) |

(52) U.S. Cl.
CPC ............ *B06B 1/0207* (2013.01); *H04N 5/2252* (2013.01)

(58) Field of Classification Search
USPC ............... 348/208.3, 208.5, 208.99; 359/233, 359/694, 822–824; 310/317, 328, 800
See application file for complete search history.

(56) References Cited

U.S. PATENT DOCUMENTS

| | | | |
|---|---|---|---|
| 2,920,276 A | 1/1960 | Jonker et al. | |
| 5,365,141 A | 11/1994 | Kawai et al. | |
| 5,828,393 A | 10/1998 | Hotomi | |
| 8,427,115 B2 | 4/2013 | Nitta | |
| 2002/0057038 A1 | 5/2002 | Shibatani | |
| 2009/0147377 A1* | 6/2009 | Polyakov et al. | 359/694 |
| 2012/0075519 A1* | 3/2012 | Blasch | 348/340 |
| 2014/0168799 A1* | 6/2014 | Hubert et al. | 359/824 |

FOREIGN PATENT DOCUMENTS

| | | |
|---|---|---|
| WO | WO-2008076271 A2 | 6/2008 |
| WO | WO-2008076399 A2 | 6/2008 |

OTHER PUBLICATIONS

Mangeot, Charles, "Development of a Low Voltage Dielectric Electro-Active Polymer Actuator", Actuator 2012 Conference, Bremen, Germany, Jun. 18, 2012, (6 pages).
PCT International Search Report and Written Opinion (dated Oct. 23, 2014), International Application No. PCT/US2014/049483, International Filing Date Aug. 1, 2014, (9 pages).

* cited by examiner

*Primary Examiner* — Thomas Dougherty
(74) *Attorney, Agent, or Firm* — Blakely, Sokoloff, Taylor & Zafman LLP

(57) ABSTRACT

A driver circuit for electro-active polymer (EAP) device has a shared, voltage boost circuit that is coupled to drive a common terminal of first and second EAP devices to a given voltage. A first voltage boost circuit is coupled to drive a respective terminal of the first EAP device to an opposite polarity voltage, while a second voltage boost circuit is coupled to drive a respective terminal of the second EAP device to an opposite polarity voltage. Other embodiments are also described and claimed.

6 Claims, 6 Drawing Sheets

DRIVER CIRCUIT FOR ELECTRO-ACTIVE POLYMER DEVICES

An embodiment of the invention relates to electronic circuits for driving the electrodes of an electro-active polymer (EAP) device. Other embodiments are also described.

BACKGROUND

EAP materials have been used to produce a force, as an electrically controlled and powered actuator. An EAP device or actuator has a layer of EAP material (such as a dielectric elastomer) that is sandwiched by a pair of compliant electrodes. When a sufficient voltage is applied to the compliant electrodes, the input electrical energy is transformed into mechanical work, for example, as an electromechanical thickness and/or planar strain. Some EAP devices require relatively high drive voltages to be applied to their electrodes, for example, around 500 volts, albeit at fairly low current levels (e.g., around 10 micro amperes for example). In most applications, the driver circuit for an EAP device is a voltage boost circuit that produces the high drive voltage from a relatively low voltage dc input source such as, for example, a lithium ion cell battery. An EAP device works in accordance with the following approximate relationship $$S_z = -\varepsilon_r \varepsilon_0 \frac{V^2}{Y t^2} \quad \text{(Equation 1)}$$

Where t is the thickness of the dielectric elastomer, Y represents the modulus of elasticity of the elastomer material, $\varepsilon_0$ denotes the permittivity of free space and $\varepsilon_r$ is the dielectric constant of the elastomer.

Using further approximations, and assuming that a thickness compression results in a corresponding biaxial or planar strain, the EAP device can also elongate in the planar direction according to the following formula, $$S_{planar} = \frac{1}{\sqrt{1 - \varepsilon_r \varepsilon_0 \frac{V^2}{Y t^2}}} - 1 \quad \text{(Equation 2)}$$

In some instances, there may be multiple EAP devices that need to be controlled separately, as part of the same, for example, consumer electronics device. A solution for the driver circuit in such a case is to provide a separate high voltage driver circuit that is connected to the electrode pairs of its respective EAP device, where each driver is separately controllable and can produce the "full scale" voltage needed, e.g. upwards of 500 volts, to produce the desired displacement.

SUMMARY

The conventional solution described above for driving separate EAP devices, namely using separately controllable high voltage driver circuits where each driver circuit can produce the full scale voltage needed by its associated EAP device, presents a problem in instances where physical space for housing the driver circuits is limited. It has been also discovered that the size of such a driver circuit scales non-linearly with the drive voltage, which may be due to the need to electrically isolate the high voltage nodes of the driver circuit. As a result, the size of, for example, a single 500 volt driver is much larger than two 250 volt drivers that are connected to each other in series. Furthermore, it has also been recognized that an EAP device works in a non-linear fashion, by in essence actuating as the square of its drive voltage—see Equations 1 and 2 introduced above. Accordingly, this may result in, for example, about seventy-five percent (75%) of the strain produced by an EAP device originating from the upper fifty percent (50%) of its drive voltage. See the example displacement vs. voltage curve for a single high voltage driver circuit mentioned below. These two non-linearities may be unexpectedly combined, within an embodiment of the invention, to allow for N EAP devices, where N is greater than or equal to two, to be driven by N+1 "lower voltage" drivers, i.e. ones that cannot reach the full scale voltages of the EAP devices. In one embodiment, a single voltage boost circuit (well below full scale drive capability) is shared by all of the N EAP devices. A further voltage boost circuit (also much less than full scale drive) is provided to drive a respective terminal of each EAP device, to an opposite polarity voltage. This allows each EAP device to effectively receive its full scale drive voltage, but using overall less physical space for the driver electronic circuitry as a whole, as compared to the solution above that uses a separate full scale drive voltage circuit for each EAP device.

An embodiment of the invention is a driver circuit for two or more EAP devices. A shared voltage boost circuit is coupled to drive a common terminal of first and second EAP devices to a particular voltage. There is also a first voltage boost circuit that is coupled to drive a respective terminal of the first EAP device to an opposite polarity voltage. In addition, a second voltage boost circuit is coupled to drive a respective terminal of the second EAP device, to an opposite polarity voltage. Each of the shared voltage boost circuit and the first and second voltage boost circuits can be limited to substantially less than the full scale drive voltage needed by any one of the EAP devices. The shared voltage boost circuit can drive the common terminal to a fixed voltage while the first and second voltage boost circuits are each independently controllable to drive the respective terminals of the first and second EAP devices to variable, opposite polarity voltages.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

DETAILED DESCRIPTION

Several embodiments of the invention with reference to the appended drawings are now explained. Whenever the shapes, relative positions and other aspects of the parts described in the embodiments are not clearly defined, the scope of the invention is not limited only to the parts shown, which are meant merely for the purpose of illustration. Also, while numerous details are set forth, it is understood that some embodiments of the invention may be practiced without these details. In other instances, well-known circuits, structures, and techniques have not been shown in detail so as not to obscure the understanding of this description.

Figure 1A:
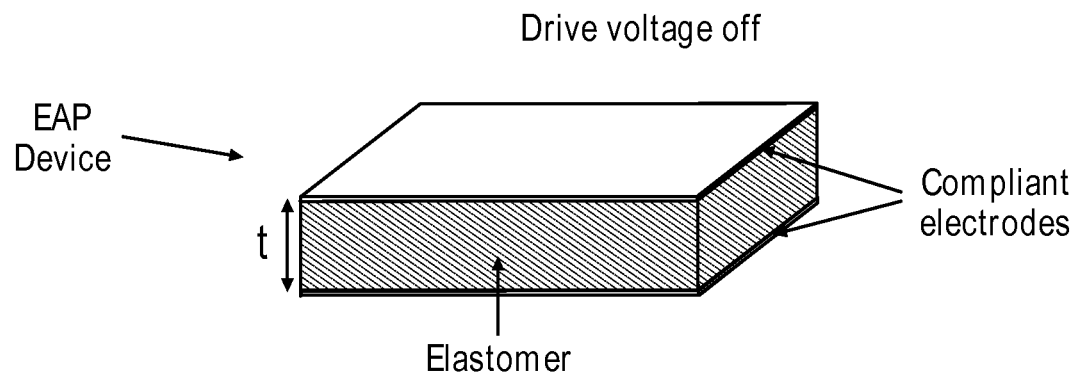
FIG. 1A depicts an EAP device in its drive voltage off state.
Figure 1B:
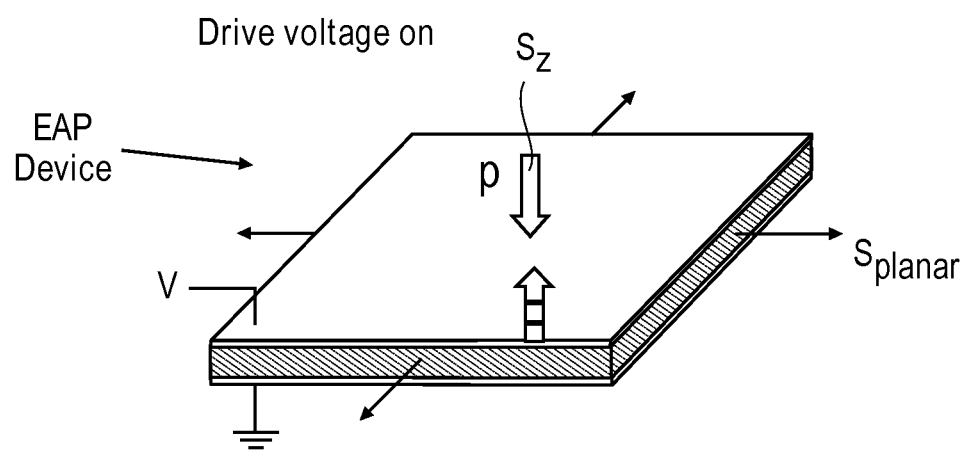
FIG. 1B depicts an EAP device in its drive voltage on state that results in both thickness and planar stress being produced.

FIG. 1A depicts an EAP device in its drive voltage off state. The EAP device is generically illustrated as a piece of elastomer material, such as a dielectric elastomer having a thickness t and being sandwiched by a pair of compliant electrodes on its opposite faces as shown. A drive voltage will be applied to the compliant electrodes, as depicted in FIG. 1B. This causes an electromechanical thickness strain $S_z$ to be produced as per Equation (1) above, at least to a first order, and also a bi-axial or planar strain $S_{planar}$ to be produced, at least to a first order, in accordance with Equation (2) given above. The EAP device "shrinks" back to its inactive state once the drive voltage has been turned off, that is, reduced to a sufficiently low voltage. Although not shown, the strain generated by the EAP device may counter a bias or spring force that is either built into the EAP device or into the actuator. The strain may need to be sufficiently high so as to overcome such a bias or spring force, before the desired displacement is produced. FIG. 2B illustrates a displacement vs. voltage curve for an example EAP device. In some cases, the full scale drive voltage $V_{full\ scale}$ that achieves the maximum useable displacement may be in the several hundred volt range, and in particular around 500 volts in this example.

Figure 2A:
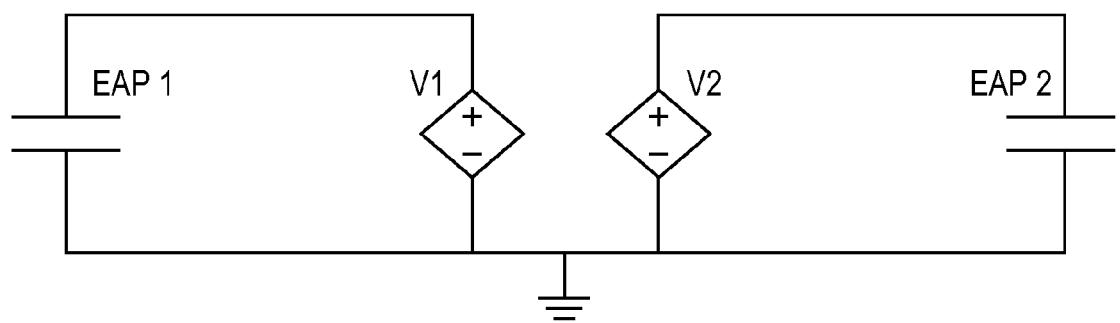
FIG. 2A is a circuit schematic of dual, full scale drivers for driving a pair of EAP devices.
Figure 2B:
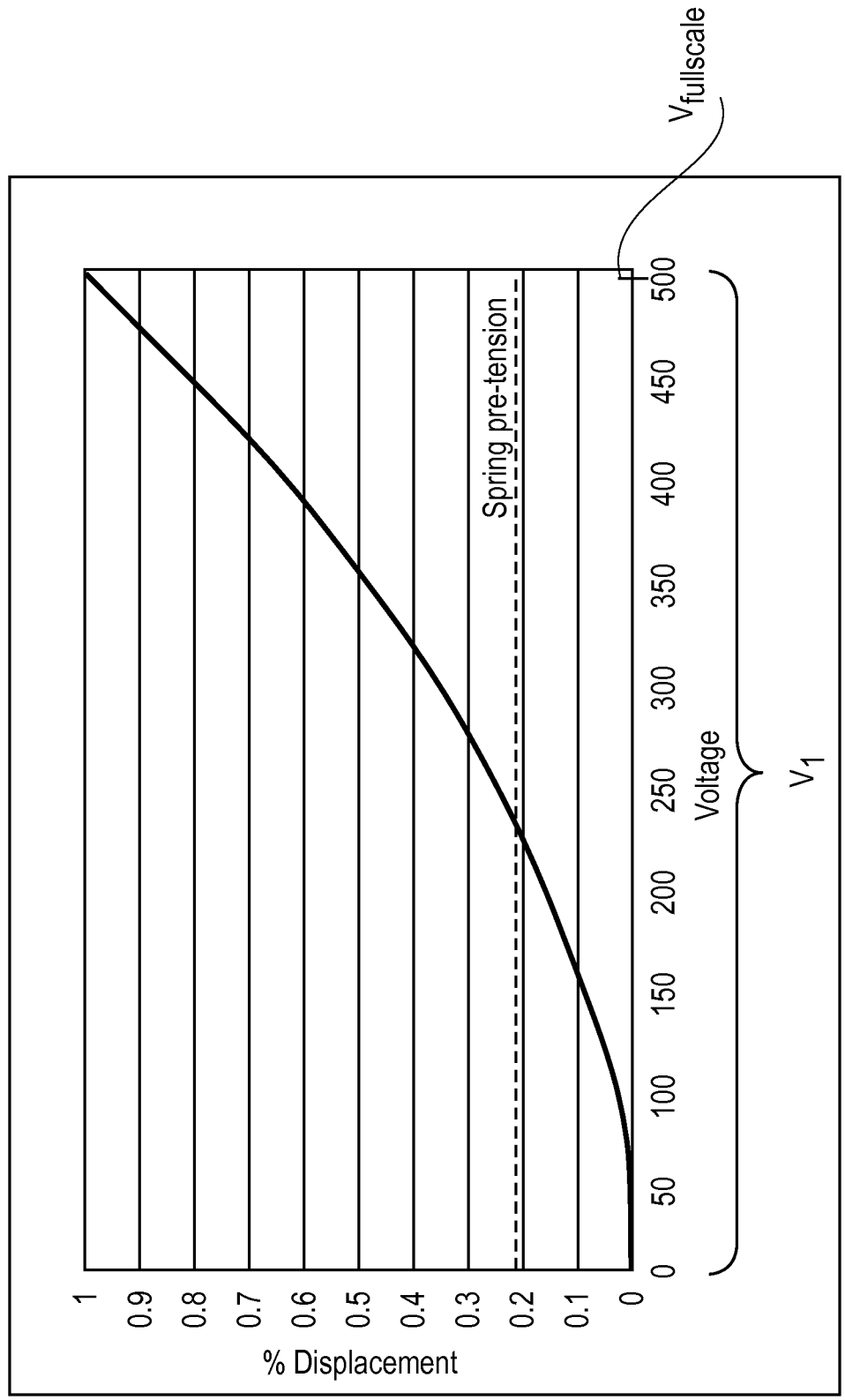
FIG. 2B is a plot of normalized displacement vs. drive voltage for a single EAP device.

The graph in FIG. 2B plots a normalized displacement variable of an EAP device vs. the voltage of a single driver that is directly driving the complimentary electrodes of the EAP device, as depicted in the circuit schematic of an actuator system in FIG. 2A. The latter depicts an actuator system having a pair of EAP devices, EAP1, EAP2, where each has its respective voltage driver V1, V2 coupled to drive its respective electrodes, while a common ground or return node is shared by the other complimentary electrodes of the two EAP devices. The graph shows that as the voltage of driver V1 varies from zero to in this case $V_{full\ scale}$=500 volts, the EAP device produces a displacement that is somewhat non-linear. In addition, a spring pre-tension or bias line is shown, as a horizontal line that represents a pre-bias or pre-tension that may be added, such that real displacement does not occur until there is sufficient voltage that the displacement curve rises above the pre-tension horizontal line. Thus, in this example, there is effectively little or no displacement until the drive voltage V1 has reached about 250 volts. Of course, the voltage values given here are just examples; the concepts here apply as well to other pre-tension settings and $V_{full\ scale}$ values. Also, in some embodiments, there may be no spring pre-tension, although in many instances such a bias is desirable to ensure an automatic return of the EAP device to a known resting position upon removal of all power from the actuation system.

Referring to FIG. 2A, it can be seen that in this particular solution for how to drive two EAP devices at the same time, a separate voltage boost or voltage driver circuit V1, V2 is coupled to the complimentary electrode pairs of EAP1, EAP2, respectively. Each of these voltage drivers needs to provide the full scale drive voltage $V_{full\ scale}$ of its associated EAP device. In situations where this full scale voltage is fairly high, such as around 500 volts, a more physically compact solution for the driver circuitry can instead be had, in accordance with the circuit schematic of FIG. 3A.

Figure 3A:
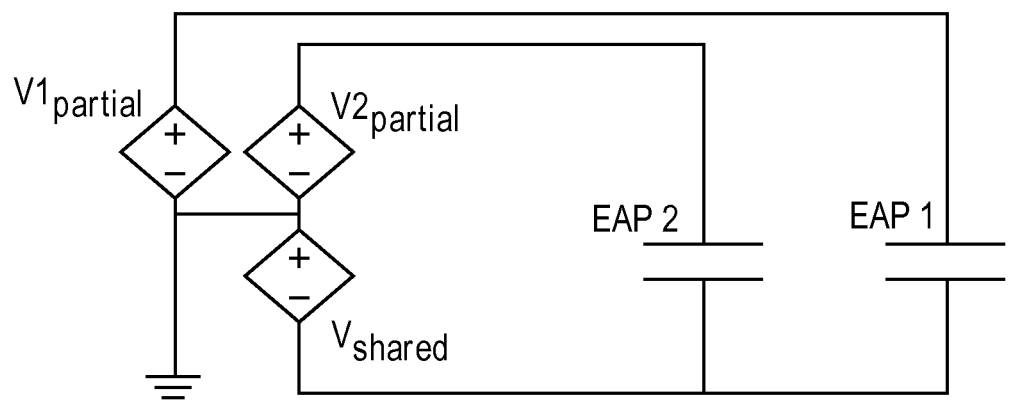
FIG. 3A is a circuit schematic of a driver circuit for at least two EAP devices in which a single boost circuit $V_{shared}$ is shared by the two EAP devices and is connected to a partial scale driver for each device.

In FIG. 3A, a shared, voltage boost circuit Vshared is coupled to drive a common terminal of the first and second EAP devices EAP1, EAP2, to a given voltage, where the common terminal is directly connected to the so-called "lower" electrodes of EAP1, EAP2. The shared voltage boost circuit has a lower output node that is coupled to the common terminal of the first and second EAP devices, and an upper output node that is coupled to the lower output nodes of first and second voltage boost circuits $V1_{partial}$ and $V2_{partial}$. In this example, the shared voltage is a negative voltage that is obtained by boosting from a much smaller dc input voltage source that is referenced to ground, such as a portable consumer electronics device's battery (not shown). As an example, the possible range for Vshared is given in the graph of FIG. 3B as between −250 volts and 0 volts. Of course, this is just an example as the actual value of $V_{shared}$ (that is applied to the common terminal of EAP1, EAP2) may be different depending upon the particular application and should be selected in view of $V_{fullscale}$ and the characteristic displacement vs. voltage curve of the particular EAP device, such as the curve depicted in FIG. 2B.

The driver circuit in FIG. 3A has a first voltage boost circuit $V1_{partial}$ which is coupled to drive an "upper" terminal or electrode of EAP1, to an opposite polarity voltage, that is opposite $V_{shared}$, and that provides only a part of (or a fraction of) the full scale voltage needed to actuate EAP1 to its maximum useable distance. In addition, a second voltage boost circuit $V2_{partial}$ is coupled to drive an upper terminal or electrode of EAP2, also to an opposite polarity voltage that provides only part of the full scale voltage needed to actuate EAP2 to its max useable distance. In this example, the range of the opposite polarity voltage $V1_{partial}$ or $V2_{partial}$ (or both) is given in FIG. 3B as between 0 volts and +250 volts.

Figure 3B:
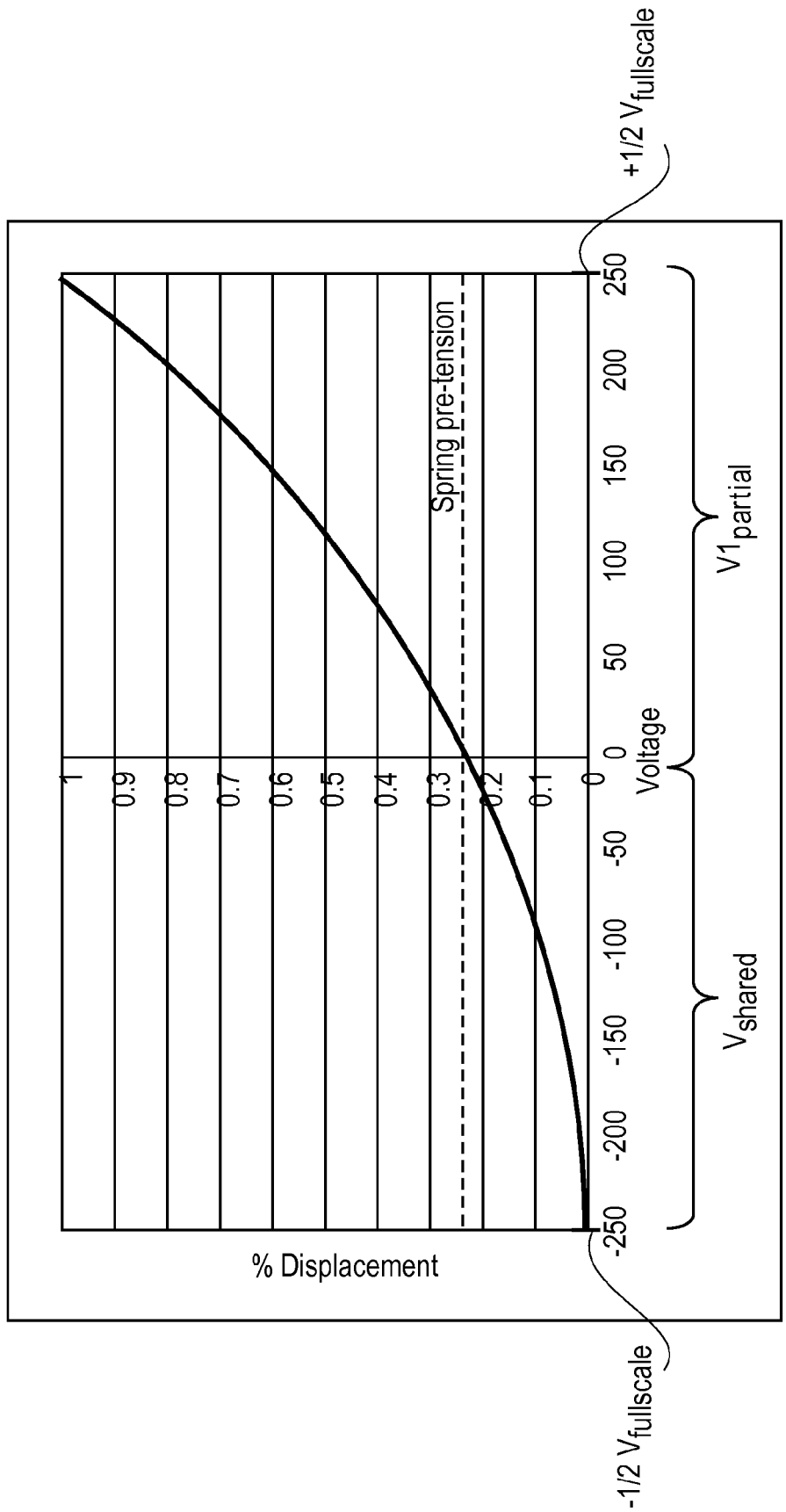
FIG. 3B is a displacement vs. voltage curve for one of the EAP devices of FIG. 3A.

The voltage limits in the example of FIG. 3B are selected to be about one-half of the full scale voltage $V_{full\ scale}$ of a given EAP device, such that when combined, $V1_{partial} - V_{shared} = V1_{full\ scale}$, thereby allowing the EAP device to reach its maximum useable displacement. More generally however, the limits or allocations between $V1_{partial}$ and $V_{shared}$ need not be at one-half of $V1_{full\ scale}$. For instance, $V1_{partial}$ may have a limit of $$\frac{+2}{3} V1_{full\ scale},$$

while $V_{shared}$ is limited to $$\frac{-1}{3} V1_{full\ scale},$$

such that their "sum" still yields $V1_{fullscale}$. Note that other suitable fractions of $V_{fullscale}$ can be selected for the partial and shared voltages. Also, EAP 2 may have a different full scale voltage than EAP1, such that $V2_{partial}$ may have a different limit than $V1_{partial}$ yet still be able achieve the sum $V2_{partial} - V_{shared} = V2_{fullscale}$.

To verify that the circuit in FIG. 3A will work to achieve the maximum useable displacement that can be obtained using the single output full scale driver of FIG. 2A, consider the "delta voltage" across the complimentary terminals of, for example, EAP1, in the embodiment of FIG. 3A, which is depicted in the graph of FIG. 3B (the displacement curves in FIG. 3B and FIG. 2B are identical). It can be seen that to achieve the same displacement as in FIG. 2B, $V_{shared}$ may be set to $$\frac{-1}{2} V_{full\ scale},$$

while $V1_{partial}$ can be varied between 0 and $$\frac{+1}{2} V_{full\ scale}$$

volts. This is because $V1_{partial}$ and $V_{shared}$ are connected as shown, across the complimentary terminals or electrodes of EAP1. A similar benefit is obtained when driving EAP2 at the same time, by recognizing that $V2_{partial}$ and $V_{shared}$ are directly connected across EAP2.

In one embodiment, the shared voltage boost circuit $V_{shared}$ drives the common terminal of EAP1, EAP2 (their lower electrodes) to a fixed voltage, e.g. $-\frac{1}{2} V_{full\ scale}$, while the first and second positive voltage boost circuits $V1_{partial}$, $V2_{partial}$ are each independently controllable so as to drive the respective upper electrodes of their EAP devices to variable and opposite polarity voltages, such that the delta voltage across the electrodes of each EAP device can achieve the desired $V_{full\ scale}$.

This solution does not rely upon any single voltage boost circuit that is to produce the entire $V_{full\ scale}$. In other words, none of the drivers or voltage boost circuits is to produce a full scale voltage that is needed to drive the terminals of each of the EAP1, EAP2 devices to obtain maximum useable displacement of each EAP device. This aspect advantageously enables a smaller circuit footprint by avoiding high voltage circuitry, even though three voltage boost circuits are needed (FIG. 3A) as compared to FIG. 2A. For instance, each of the voltage boost circuits could be designed to produce no more than three hundred (300) Volts, where this is insufficient delta voltage to drive any of the EAP devices to cause maximum useable displacement. To achieve max useable displacement of EAP1, the $V_{shared}$ and $V1_{partial}$ driver or voltage boost circuits are directly connected together so that their voltages are combined to reach the full scale voltage of EAP1. Similarly, the $V_{shared}$ and $V2_{partial}$ voltage boost circuits combine to reach the full scale voltage of EAP2.

Figure 4:
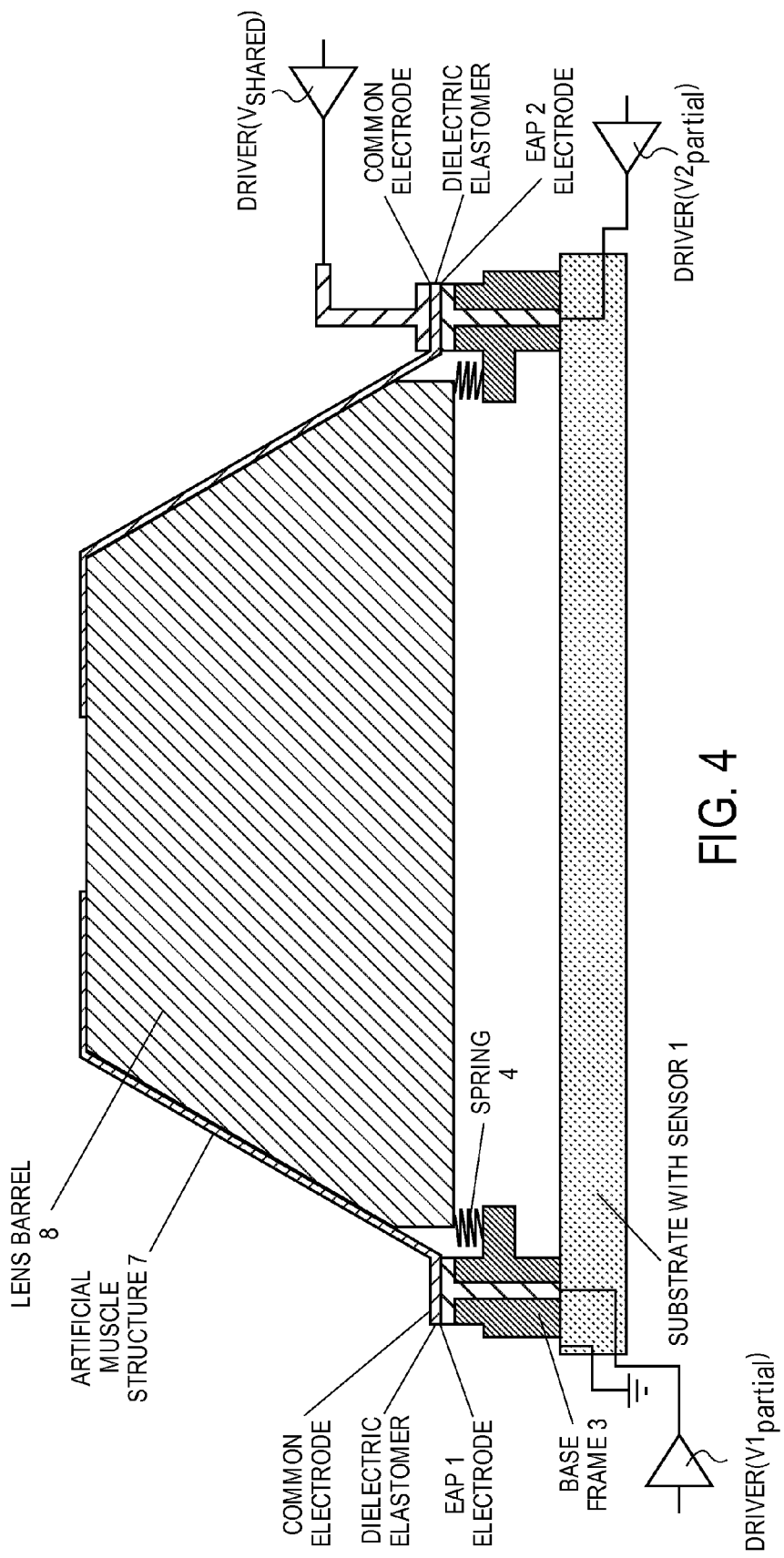
FIG. 4 is a combined cross-section view and circuit schematic of a dual EAP actuator in a camera application.

Turning now to FIG. 4, this is a combined cross-section view and circuit schematic of a multiple EAP device actuator for a camera function. The camera functionality may be integrated into a battery powered portable consumer electronics device such as smartphone, a tablet computer, or a laptop computer, in which physical space comes at a premium. The figure depicts camera optics including a lens barrel 8 to which an artificial muscle structure 7 is attached. The artificial muscle 7 has a first EAP device made of an EAP1 electrode and a portion of a common electrode that sandwich a portion of a dielectric elastomer layer. In addition, the muscle structure 7 has a second EAP device made of an EAP2 electrode and another portion of the common electrode that sandwich a further dielectric elastomer layer. The common electrode is directly driven by a shared voltage driver $V_{shared}$, while the complementary electrodes of EAP1 and EAP2 are directly driven by their respective partial voltage drivers $V1_{partial}$ and $V2_{partial}$. Connections to the electrodes are through a base frame 3 and a substrate 1 which has an image sensor (not shown) that is in the optical path of the lens contained in the barrel 8. A spring 4 is provided to pre-tension part of the actuator, such as the EAP1 device, by using the frame 3 to push against the lens barrel 8. The EAP1 device may be coupled to control a first aspect of the optics such as focusing imaging lens position (position of lens barrel 8 along the camera optical axis), while the EAP2 device may be coupled to control another aspect such as aperture size that controls how much light from the scene enters the imaging lens. Other camera lens and optics arrangements and pre-tension schemes for use with such a multi-EAP device actuator are of course possible.

As was described above in connection with for example the embodiment of FIG. 3A, the voltage driver circuitry in FIG. 4 also has a shared, voltage boost circuit that is coupled to apply the same voltage to the lower electrodes of the first and second EAP devices, a first voltage boost circuit $V1_{partial}$ that is coupled to apply an opposite polarity voltage to a respective upper electrode of the first EAP device, and a second voltage boost circuit $V2_{partial}$ that is coupled to apply an opposite polarity voltage to a respective electrode of the second EAP device. In one embodiment, the first and second voltage boost circuits are each positive voltage boost circuits and are each directly connected to a common ground or zero voltage node, and the shared voltage boost circuit is a negative voltage boost circuit (that is also directly connected to the common ground or zero voltage node). All of the voltage boost circuits may receive a dc input voltage that has been derived from a rechargeable battery that powers the portable device (not shown).

Another embodiment of the invention is an automatic process for controlling multiple EAP devices as follows. A shared voltage is applied to a lower electrode of a first EAP device and to a lower electrode of a second EAP device, such that the two electrodes are maintained at the shared voltage. While doing so, an opposite polarity voltage is applied to an upper electrode of either the first EAP device or the second EAP device, in order to obtain a desired displacement from that EAP device, in accordance with a delta voltage that combines an absolute value of the shared voltage with an absolute value of the opposite polarity voltage. To obtain a desired displacement from the other EAP device, while applying the shared voltage to the lower electrodes of the first and second EAP devices, a further opposite polarity voltage is applied to the other EAP device. The shared voltage can be a negative voltage, while the opposite polarity voltages applied to the upper electrodes are positive voltages. The opposite polarity voltages (that are applied to the upper electrodes) can be varied, while maintaining the shared voltage on the lower electrodes fixed.

In one embodiment, the shared voltage applied to the lower electrodes and the opposite polarity voltages applied to the upper electrodes are at least two hundred (200) Volts each in absolute value, as related to ground, and together drive the electrodes of each of the first and second EAP devices to a delta voltage of more than four hundred fifty (450) Volts.

While certain embodiments have been described and shown in the accompanying drawings, it is to be understood that such embodiments are merely illustrative of and not restrictive on the broad invention, and that the invention is not limited to the specific constructions and arrangements shown and described, since various other modifications may occur to those of ordinary skill in the art. For example, although the figures depict an actuator having two EAP devices, the concept of the shared voltage boost circuit is generally applicable to actuation systems having N (being two or more) EAP devices using N+1 voltage boost circuits one of which is a shared voltage boost circuit. The description is thus to be regarded as illustrative instead of limiting.

What is claimed is:

1. An electronic device having a camera function, comprising:
    a portable consumer electronics device having integrated therein
        camera optics,
        a first EAP device that is coupled to control a first aspect of the camera optics,
        a second EAP device that is coupled to control a second aspect of the camera optics,
        a shared, voltage boost circuit coupled to apply the same voltage to lower electrodes of the first and second EAP devices,
        a first voltage boost circuit that is coupled to apply an opposite polarity voltage to a respective upper electrode of the first EAP device, and
        a second voltage boost circuit that is coupled to apply an opposite polarity voltage to a respective upper electrode of the second EAP device.

2. The device of claim 1 wherein the first aspect of the camera optics is an aperture, and the second aspect is focusing lens position.

3. The device of claim 1 wherein the portable consumer electronics device is one of a smartphone, a tablet computer, and a laptop computer.

4. The device of claim 1 wherein the first and second voltage boost circuits are each positive voltage boost circuits and are each directly connected to a common ground or zero voltage node, and the shared voltage boost circuit is a negative voltage boost circuit that is also directly connected to the common ground or zero voltage node.

5. The device of claim 1 wherein none of the shared, first and second voltage boost circuits by itself can produce sufficient voltage to drive the electrodes of each of the first and second EAP devices to cause maximum useable displacement.

6. The device of claim 5 wherein the shared, first and second voltage boost circuits can each produce no more than three hundred (300) Volts.

* * * * *